United States Patent
Hansen et al.

(10) Patent No.: US 11,911,838 B2
(45) Date of Patent: Feb. 27, 2024

(54) ELECTRON BEAM INSTALLATION AND METHOD FOR WORKING POWDERED MATERIAL

(71) Applicant: pro-beam GmbH & Co. KGaA, Gilching (DE)

(72) Inventors: Björn Hansen, Munich (DE); Gerhard Huber, Bodenkirchen (DE); Thorsten Löwer, Munich (DE)

(73) Assignee: pro-beam GmbH & Co. KGaA (DE)

( * ) Notice: Subject to any disclaimer, the term of this patent is extended or adjusted under 35 U.S.C. 154(b) by 618 days.

(21) Appl. No.: 16/492,826

(22) PCT Filed: Feb. 26, 2018

(86) PCT No.: PCT/EP2018/054608
§ 371 (c)(1),
(2) Date: Sep. 10, 2019

(87) PCT Pub. No.: WO2018/162261
PCT Pub. Date: Sep. 13, 2018

(65) Prior Publication Data
US 2020/0147717 A1    May 14, 2020

(30) Foreign Application Priority Data
Mar. 10, 2017    (DE) .................... 10 2017 105 193.7

(51) Int. Cl.
*B23K 15/00*     (2006.01)
*B33Y 10/00*     (2015.01)
(Continued)

(52) U.S. Cl.
CPC .......... *B23K 15/0086* (2013.01); *B22F 10/28* (2021.01); *B22F 10/37* (2021.01);
(Continued)

(58) Field of Classification Search
CPC .............. B23K 15/0086; B23K 15/002; B23K 15/0026; B23K 26/342; B23K 26/70;
(Continued)

(56) References Cited

U.S. PATENT DOCUMENTS 3,925,702 A    12/1975    Hofstein
6,136,257 A    10/2000    Graf et al.
(Continued)

FOREIGN PATENT DOCUMENTS

| CN | 104226997 | 12/2014 |
| CN | 104900469 | 9/2015 |

(Continued)

OTHER PUBLICATIONS

Feng, Lin et al., "Study Progress in Metal-Powder Electron Beam Selective Melting Technology", Oct. 31, 2009, pp. 511-517, English abstract included.
(Continued)

*Primary Examiner* — John J Norton
*Assistant Examiner* — Simpson A Chen
(74) *Attorney, Agent, or Firm* — Haynes and Boone, LLP

(57) ABSTRACT

An electron beam installation, which is used for processing powdered material, has a powder container, which can accommodate a powder bed made of the powdered material to be processed. Furthermore, it has an electron beam generator, which is configured to direct an electron beam onto laterally differing locations of the powder bed. To reduce the dispersion of the powdered material during the processing using the electron beam, the electron beam installation has a frit device, which, by applying an AC voltage between at least two electrodes, generates an electromagnetic alternating field, which bonds the powdered material of the powder bed, at least in regions over the powder bed.

12 Claims, 3 Drawing Sheets

(51) Int. Cl.
  *B33Y 30/00* (2015.01)
  *H01J 37/305* (2006.01)
  *B22F 12/41* (2021.01)
  *B22F 10/28* (2021.01)
  *B22F 12/00* (2021.01)
  *B22F 10/37* (2021.01)

(52) U.S. Cl.
  CPC .............. *B22F 12/00* (2021.01); *B22F 12/41* (2021.01); *B23K 15/002* (2013.01); *B23K 15/0026* (2013.01); *B33Y 10/00* (2014.12); *B33Y 30/00* (2014.12); *H01J 37/305* (2013.01); *B22F 2202/05* (2013.01); *H01J 2237/3128* (2013.01)

(58) Field of Classification Search
  CPC ... B23K 26/125; B23K 26/126; H01J 37/305; H01J 2237/3128; B22F 12/41; B22F 10/28; B22F 12/30; B33Y 10/00; B33Y 30/00; B01J 2219/0879; B01J 2219/0894; B01J 2219/12
  USPC ........................................................ 219/76.1
  See application file for complete search history.

(56) References Cited

U.S. PATENT DOCUMENTS

| | | | |
|---|---|---|---|
| 6,533,995 | B1 | 3/2003 | Wullenweber et al. |
| 9,328,976 | B1 | 5/2016 | Lasko et al. |
| 9,773,635 | B2 | 9/2017 | Lissotschenko |
| 9,984,849 | B2 | 5/2018 | Hammer et al. |
| 10,875,258 | B2 | 12/2020 | Bamberg et al. |
| 2012/0329659 | A1* | 12/2012 | Holcomb ................ B22F 10/20 505/400 |
| 2014/0314964 | A1* | 10/2014 | Ackelid ................ B33Y 70/00 204/192.1 |
| 2014/0370323 | A1 | 12/2014 | Ackelid |
| 2015/0306699 | A1* | 10/2015 | Honda ................ B33Y 30/00 219/76.12 |
| 2016/0221100 | A1 | 8/2016 | Fisser et al. |
| 2016/0375492 | A1* | 12/2016 | Bencher ................ B33Y 30/00 419/26 |
| 2017/0165748 | A1 | 6/2017 | Kamachi et al. |
| 2017/0165791 | A1* | 6/2017 | Kamachi ................ B23K 26/70 |
| 2017/0203363 | A1* | 7/2017 | Rowland ................ B22F 10/30 |

FOREIGN PATENT DOCUMENTS

| | | |
|---|---|---|
| CN | 104959601 | 10/2015 |
| CN | 205341921 | 6/2016 |
| CN | 205464328 | 8/2016 |
| DE | 10 2015 201796 | 6/2016 |
| DE | 10 2015 214 994.3 | 2/2017 |
| EP | 3178586 | 6/2017 |
| EP | 3363564 | 8/2018 |
| EP | 3363564 A1 * | 8/2018 ............. B33Y 30/00 |
| JP | 2015176685 | 10/2015 |

OTHER PUBLICATIONS

International Search Report and Written Opinion for International Application No. PCT/EP2018/054608, dated Jun. 14, 2018, with English Translation, 14 pages.

German Office Action for German Application No. 10 2017 105 193.7 dated Nov. 29, 2017, with English translation, 10 pages.

European Office Action for European Application No. 18 708 632.7 dated Oct. 30, 2020, with English translation, 14 pages.

Japanese Office Action for Japan Patent Application No. 2019-540081 dated Dec. 14, 2021, with English translation, 8 pages.

Chinese Office Action for China Patent Application No. 201880013943.4 dated May 30, 2021, with English translation, 14 pages.

* cited by examiner

ELECTRON BEAM INSTALLATION AND METHOD FOR WORKING POWDERED MATERIAL

BACKGROUND OF THE INVENTION

1. Area of the Invention

The invention relates to an electron beam installation, which is used for processing powdered material, comprising
a) a powder container, which can accommodate a powder bed made of the powdered material to be processed, and comprising
b) an electron beam generator, which is configured to direct an electron beam onto laterally differing locations of the powder bed.

The invention furthermore relates to a method for processing powdered material using such an electron beam installation.

2. Description of the Prior Art

In recent time, workpieces have been frequently created by so-called 3D printing methods. In this case, 3D printing methods are used, inter alia, in which, for example, using a laser beam, a powdered material in a powder bed is bonded by selective fusion of the individual powder particles, in particular point-by-point and layer-by-layer, to form a 3D structure.

Based on such 3D printing methods, corresponding experiments have also been carried out using electron beam installations. However, it has been shown in this case that the incident electron beam disperses a majority of the powder particles from the powder bed in the case of specific powdered materials, i.e., they are distributed out of the powder bed into other regions of the electron beam installation before the fusion process occurs. Therefore, according to the present prior art, after a further layer of the powdered material in the form of the powder bed has been applied, preheating it to bond the individual powder particles to one another with less adhesion than in the final product is known.

The powder particles are then only melted in a second step using the electron beam along the respective contour layer to be generated of a 3D structure enough that sufficient stability of the 3D structure for the later intended use of the workpiece is produced between the individual powder particles.

The disadvantages of this method are displayed in the required process time for the heating of the powder bed, since the heating has to take place again in particular for each individual applied powder layer. Moreover, the additional heat has to be introduced into the vacuum system of the electron beam installation, whereby an increased power consumption and more complex process control are necessary.

SUMMARY OF THE INVENTION

The object of the invention is therefore to specify an electron beam installation of the type mentioned at the outset, which better solves the problem of dispersion of the powdered material during the processing using the electron beam. The object of the invention is furthermore to specify a corresponding method for processing the powdered material.

This object is achieved according to the invention by an electron beam installation of the type mentioned at the outset which has a coherer device, which, by applying an AC voltage between at least two electrodes, generates an electromagnetic alternating field, which bonds the powdered material of the powder bed, at least in regions over the powder bed.

The inventors have recognized that the principle of a coherer (from "to coher"=agglomerating) known from older telegraphy, also called a coherer, is applicable to the powdered material of the powder bed of an electron beam installation for the purposes of 3D printing.

For this purpose, the inventors have firstly recognized that the dispersion of the powdered material very probably originates from the electrostatic repulsion of the powder particles from one another when the powder particles are bombarded using the electron beam and become electrostatically charged at the same time. It has been shown in this case that, contrary to obvious considerations, the dispersion also occurs in the case of materials which consist of a conductive material, for example, metal powder particles. This can be explained in that the small metal powder particles are frequently enclosed by an oxide layer, which is nonconductive. Therefore, such a metal powder particle, although it is conductive in its interior, can become electrically charged upon incidence of the electron beam and can thus effectuate the dispersion.

The so-called coherer voltage can be exceeded between adjoining powder particles by the introduction of an electromagnetic AC voltage, without an electrostatic charge occurring. Similarly as in the case of the coherer known from telegraphy, the individual powder particles are bonded to one another by the coherer current flowing in this case. The method is therefore particularly suitable for use with metallic powder as the powdered material.

The coherer device can therefore replace or supplement the known temperature control of the powder bed for the purpose of preventing or at least reducing the dispersion. Inter alia, a time reduction of the cooling phase and an energy saving of the installation can thus be achieved. Since excess powdered material with respect to the 3D structure, from which the 3D structure is removed at the end, is usually reused, moreover the aging speed of the material can be reduced by the use of the coherer device.

The electromagnetic alternating field of the coherer device is to at least bond the powdered material of the powder bed in this case enough that during subsequent processing using the electron beam, the dispersion of the powdered material is reduced. The powder particles are thus only slightly agglomerated (cohered) with one another. In contrast thereto, the processing is to be understood in particular as a selective, in particular punctiform fusion of the powdered material to arrive at a stable 3D structure. Depending on the scanning strategy, this can be created, for example, point-by-point, line-by-line, and layer-by-layer.

The frequencies at which the AC voltage of the coherer device is operated are preferably in ranges greater than 5 kHz, in particular greater than 10 kHz, preferably greater than 50 kHz. The voltages and distances of the electrodes can be selected in particular in this case so that field strengths greater than 0.5 kV/mm, in particular greater than 1 kV/mm, preferably greater than 10 kV/mm occur in the powder bed.

The power and/or the frequency of the AC voltage of the coherer device and the power of the electron beam are preferably selected so that the bonded powdered material is not dispersed during subsequent processing using the electron beam, in particular during subsequent melting using the electron beam, wherein the powdered material is only bonded by the coherer device at locations at which no processing takes place using the electron beam in such a way that the powdered material can be detached again there, in particular by impacts. In particular, the powdered material is to be detachable more easily at non-processed points than at processed points.

Different variants are conceivable for the arrangement of the electrodes of the coherer device, wherein the electrodes can be in electrical contact with the powder bed in particular. An electrode of the coherer device can even also be used for dissipating the charge introduced by the electron beam during the processing.

At least one electrode of the coherer device is preferably arranged at a fixed position inside the electron beam installation.

Preferably, at least two electrodes are arranged horizontally in a plane, in particular the same plane, parallel to an uppermost powder layer of the powder bed. In this manner, the powdered material can easily be agglomerated layer-by-layer. If the individual layers do not bond with one another in this case, after the processing using the electron beam, the powdered material which was not bonded to form a 3D structure may be detached more easily.

Preferably, at least two electrodes of the coherer device are arranged symmetrically in relation to a lateral region in which the electron beam can be directed onto the powder bed. The lateral direction relates in this case to a direction transverse to the beam direction.

However, at least two electrodes can also be arranged in a plane perpendicular to the uppermost powder layer of the powder bed. In this case, at least one electrode of the coherer device can be configured to be moved along at least one axis above the powder bed. This preferably takes place at a defined distance in relation to the powder bed. Furthermore, the electrode of the coherer device can preferably be moved over the powder bed trailing in relation to a powder application device, for example, a squeegee, using which the powdered material is applied as the powder bed. Specifically, the electrode can be implemented, for example, via a wire which is moved above the powder bed. Preferably or alternatively, a movement along two axes can also be provided.

The powder container preferably has a powder bed table base, which is electrically conductive and at the same time forms an electrode of the coherer device. The table base represents a large contact surface. In particular, the table base can also be used as an electrode for dissipating the charge introduced by the electron beam generator.

At least one electrode of the coherer device is preferably formed by the electron beam itself, by the electron beam generator being operated in a pulsed manner and/or the electron beam being deflected at high deflection speed. In this regard, the AC voltage of the coherer device can also be understood as pulsed voltage of the electron beam, which leaves the electrons sufficient time to run off from the powder particles again. In particular, the electron beam can also be accelerated using AC voltage, however. In these concepts of the invention, the additional expenditure for a coherer device is essentially reduced to a corresponding coherer control module in the installation controller.

If the electron beam generator is configured to deflect the electron beam at high deflection speed, it can be directed onto various locations of the powder bed by rapid jumping. The electron beam thus also only acts briefly on the powder particles, so that the electrons can run off again from the powder particles before the dispersion. High deflection speeds of the electron beam can comprise frequencies of greater than 1 kHz, in particular greater than 10 kHz, in particular greater than 100 kHz.

With respect to the method for processing powdered material using an electron beam installation, the method according to the invention comprises the following steps:
a) providing an electron beam installation comprising
  a powder container, which can accommodate a powder bed made of the powdered material to be processed, and comprising
  an electron beam generator, which is configured to direct an electron beam onto laterally differing locations of the powder bed;
b) applying an AC voltage between at least two electrodes using a coherer device, to generate an electromagnetic alternating field, which bonds the powdered material of the powder bed at least in regions over the powder bed;
c) processing the powdered material using the electron beam.

In this case, the powdered material is preferably a metallic powder, and the processing in step c) is a fusion of particles of the powdered material with one another in such a way that a 3D structure is gradually created by selective fusion. 3D structures may thus be created using an electron beam installation in the 3D printing method.

The use of an electron beam installation for 3D printing has the advantage in particular that approximately 1000 times higher deflection speeds are achievable for the electron beam than for a laser beam. This results in novel exposure strategies, which result in higher productivity, a thermally optimized process, and/or less warping of the 3D structure and can even have an influence on the design of the 3D structures thus created.

BRIEF DESCRIPTION OF THE DRAWINGS

Exemplary embodiments of the invention are explained in greater detail hereafter on the basis of the drawings. In the figures.

DESCRIPTION OF PREFERRED EXEMPLARY EMBODIMENTS

Figure 1:
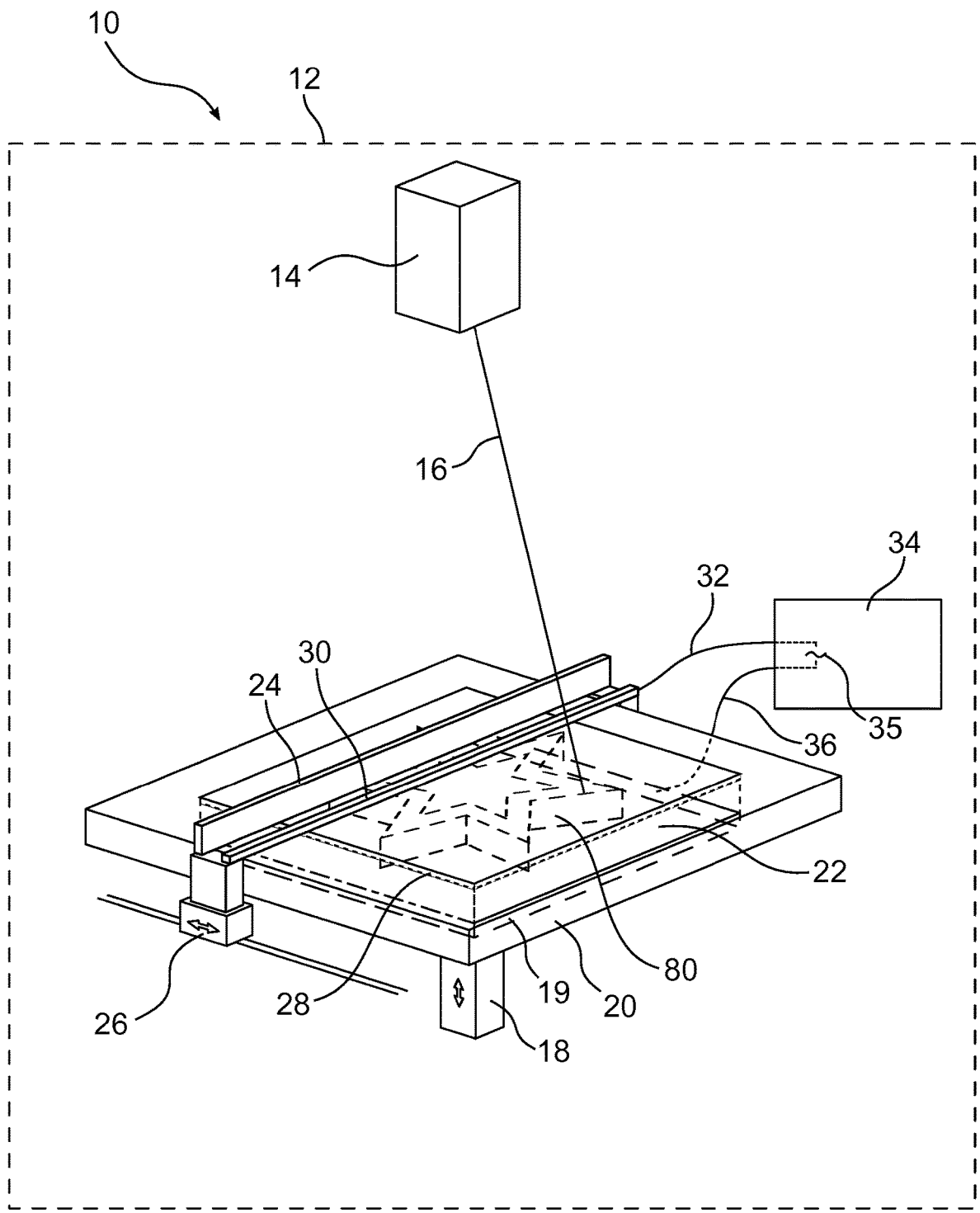
FIG. 1 shows a perspective view of an electron beam installation according to the invention comprising a powder bed table base as a powder container and a coherer device.

FIG. 1 shows an electron beam installation 10 comprising a vacuum housing 12, in which an electron beam gun 14 is arranged for generating an electron beam 16.

In the present exemplary embodiment, the electron beam gun 14 is arranged above a lifting table 18 comprising an electrically conductive lifting plate 19 and comprising a receptacle frame 20, which is used as a spatially delimited powder container, which accommodates a powder bed 22 made of a powdered material to be processed. In this case, further side walls (not shown here) can be provided for the further lateral delimitation of the powder bed 22.

If the lifting plate 19 is moved downward, the powder bed 22 can gradually occupy a region which becomes larger, so that the powder bed 22 is enlarged layer-by-layer.

For this purpose, a powder application device 24 comprising a squeegee, which can be moved using a travel device 26 over the lifting table 18, is arranged above the receptacle frame 20. The powder application device 24 has a container (not shown) for the powdered material, from which the material can be squeegeed flatly onto the powder bed 22 by a travel movement as the respective uppermost loose layer 28.

The travel device 26 furthermore also carries a coherer electrode rail 30 in the exemplary embodiment shown here, which is connected via an electric line 32 to a coherer control unit 34. The coherer electrode rail 30 can also be moved in another manner over the powder bed 22, however.

In contrast, the coherer control unit 34 is connected to the lifting plate 19 as a counter electrode via another electric line 36.

The coherer control unit 34 has an AC voltage source 35, using which AC voltage can be applied to the coherer electrode rail 30 as the first electrode and the lifting plate 19 as the second electrode.

The coherer electrode rail 30, the lifting plate 19, and also the coherer control unit 34 together form a coherer device, which can comprise still further components and the purpose of which will be explained in greater detail hereafter.

Furthermore, a 3D structure illustrated as a star by way of example is identified by the reference sign 80 in FIG. 1, which was gradually formed or "printed" by fusing individual particles in the powder bed 22 with the aid of the electron beam 16.

Figure 2:
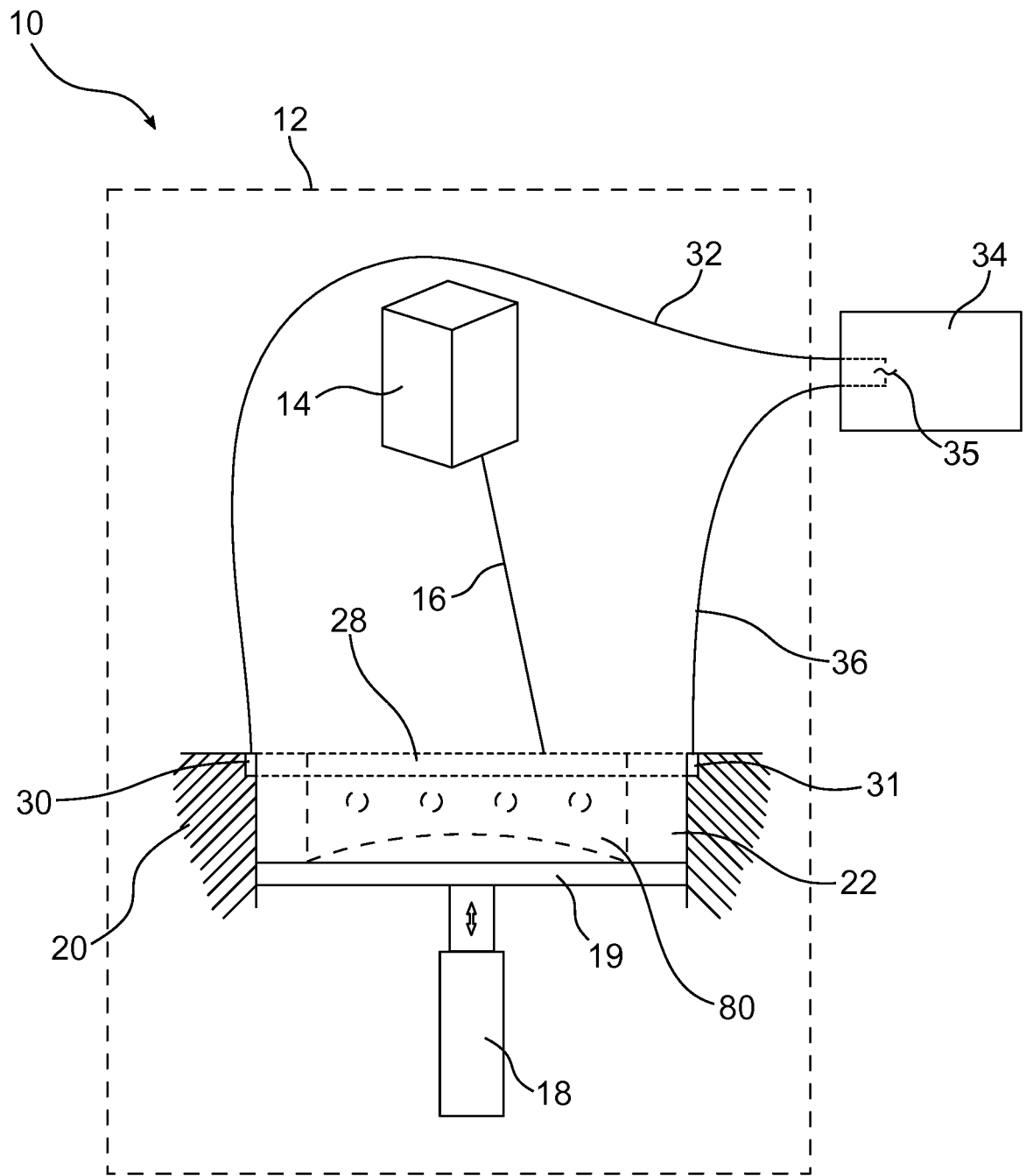
FIG. 2 shows a sectional view of an electron beam installation according to a second exemplary embodiment having a differently designed powder container for the powder bed.

A modified exemplary embodiment of the electron beam installation 10 is shown in FIG. 2, wherein functional or structurally similar components are identified by the same reference signs as in FIG. 1.

The lifting table 18 comprising a lifting plate 19, which is not necessarily electrically conductive here, can be seen in a section in FIG. 2.

However, the receptacle frame 20 supports a first strip-shaped coherer lateral electrode 30, which is connected via the line 32 to the coherer control unit 34, on its upper end on one side of the powder bed 22. An associated counter electrode is arranged as a second coherer lateral electrode 31 on the laterally opposite side of the powder bed 22 and is connected via the line 36 to the coherer control unit 34. The coherer lateral electrodes 30, 31 are thus arranged on both sides of a lateral region onto which the electron beam 16 can be directed.

Furthermore, a 3D structure 80 is clearly recognizable from FIG. 2, which is also complexly structured with recesses and bulges in the perpendicular direction in relation to the horizontal surface of the powder bed 22.

Finally, in this exemplary embodiment, the coherer control unit 34 is arranged outside the vacuum housing 12.

The electron beam installation 10 according to the invention operates as follows:

Firstly, the uppermost loose layer 28 made of powdered material is applied using the powder application device 24. Trailing the movement of the powder application device 24, still during the movement or also following the movement, an AC voltage is then applied between the electrodes 30, 31, and 19 using the coherer control unit 34.

Figure 3:
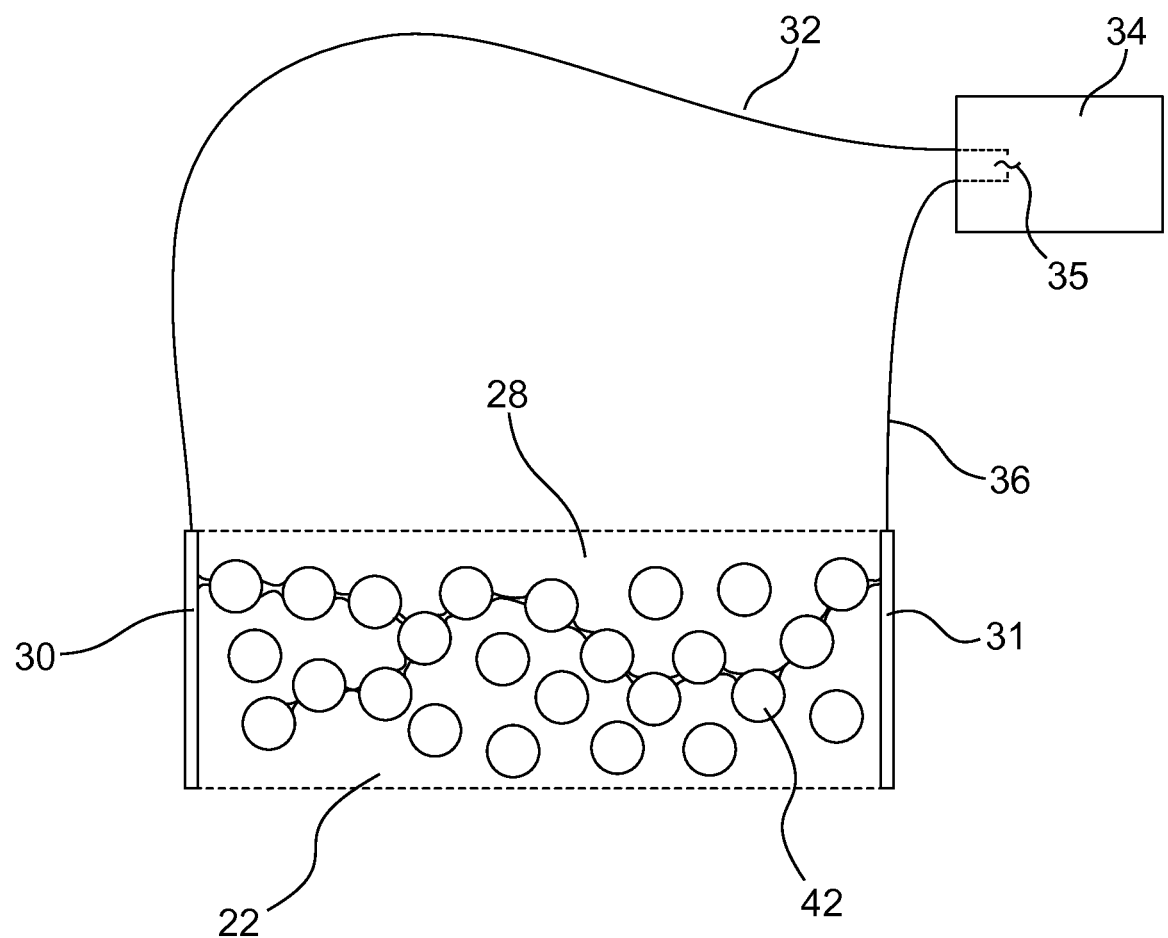
FIG. 3 shows an explanatory illustration on the procedure of cohering.

Using an AC voltage, the frequency and power of which are selected accordingly adapted to the powdered material, as is apparent from FIG. 3, individual powder particles 42 of the loose layer 28 of the powder bed 22 are then bonded to one another by slight melting. As can be seen in FIG. 3 on the basis of the filter necks between the powder particles, a chain of powder particles 42 thus results, which has a higher and/or more continuous electrical conductivity than the loose powder particles 42 in the powder bed 22.

During this procedure, the powder particles 42 are not dispersed out of the powder bed 22, since as a result of the AC voltage, the powder particles 42 do not become electrostatically charged and nonetheless a sufficiently high coherer current can be generated, which causes at least a part of the powder particles 42 to melt and "agglomerate" with one another.

Subsequently, a more solid bond is created using the electron beam gun 14 by stronger melting of the powder particles 42 at points predetermined by the 3D structure 80 to be created of the powder bed 22 prepared via the coherer device and/or its uppermost loose layer 28. More solid in this context means that at the points processed by the electron beam 16, the powder particles 42 are more solidly bonded to one another in such a way that, for example, the 3D structure 80 can be removed from the powder bed 22 by dusting off the powder particles 42 which are only cohered.

The above-described steps are each repeated layer-by-layer until the 3D structure 80 is ended.

The invention claimed is:

1. An electron beam installation, which is used for processing powdered material, comprising:
    a powder container, which can accommodate a powder bed made of the powdered material to be processed;
    an electron beam generator, which is configured to direct an electron beam onto laterally differing locations of the powder bed; and
    a coherer device which is configured to apply an AC voltage between at least two electrodes to generate an electromagnetic alternating field, which bonds the powdered material of the powder bed, at least in regions over the powder bed, wherein the frequency of the AC voltage is greater than 5 kHz.

2. The electron beam installation of claim 1, wherein the power and/or the frequency of the AC voltage of the coherer device and the power of the electron beam are selected so that the bonded powdered material is not dispersed during subsequent processing using the electron beam, wherein the powdered material at locations at which no processing takes place using the electron beam is only bonded by the coherer device such that the powdered material can be detached again at the locations by impacts.

3. The electron beam installation of claim 2, wherein subsequent processing using the electron beam comprises melting of the powdered material.

4. The electron beam installation of claim 1, wherein at least one of the electrodes of the coherer device is arranged at a fixed position inside the electron beam installation.

5. The electron beam installation of claim 1, wherein the at least two electrodes of the coherer device are arranged horizontally in a plane parallel to an uppermost powder layer of the powder bed.

6. The electron beam installation of claim 1, wherein the at least two electrodes of the coherer device are arranged symmetrically in relation to a lateral region in which the electron beam can be directed onto the powder bed.

7. The electron beam installation of claim 1, wherein at least one of the electrodes of the coherer device is configured to be moved along at least one axis above the powder bed.

8. The electron beam installation of claim 1, wherein the powder container has a powder bed table base, which is electrically conductive and at the same time forms at least one of the electrodes of the coherer device.

9. The electron beam installation of claim 1, wherein at least one of the electrodes of the coherer device is formed by the electron beam itself, by the electron beam generator being operated in a pulsed manner, and/or by the electron beam being deflected at high deflection speed.

10. The electron beam installation of claim 1, wherein the powdered material is a metallic powder, and the electron beam is configured to selectively fuse particles of the powdered material with one another to create a 3D structure.

11. A method for processing powdered material using the electron beam installation of claim 1, the method comprising the following steps:
   applying an AC voltage between the at least two electrodes using the coherer device to generate the electromagnetic alternating field; and
   processing the powdered material using the electron beam.

12. An electron beam installation, which is used for selective melting of powdered material to form a 3D structure, comprising:
   a powder container, which can accommodate a powder bed made of the powdered material to be selectively fused;
   an electron beam generator, which is configured to direct an electron beam onto laterally differing locations of the powder bed to selectively fuse the powdered material; and
   a coherer device which is configured to apply an AC voltage between at least two electrodes to generate an electromagnetic alternating field, which bonds the powdered material of the powder bed, at least in regions over the powder bed, before the selective fusion with the electron beam generator, wherein the frequencies at which the AC voltage of the coherer device is operated are greater than 5 kHz.

* * * * *

UNITED STATES PATENT AND TRADEMARK OFFICE
CERTIFICATE OF CORRECTION

| | |
|---|---|
| PATENT NO. | : 11,911,838 B2 |
| APPLICATION NO. | : 16/492826 |
| DATED | : February 27, 2024 |
| INVENTOR(S) | : Björn Hansen, Gerhard Huber and Thorsten Löwer |

It is certified that error appears in the above-identified patent and that said Letters Patent is hereby corrected as shown below:

In the Specification

In Column 1, Line 4, insert the following:
--CROSS-REFERENCE TO RELATED APPLICATIONS
This patent application is a U.S. National Stage Patent Application under 35 U.S.C. 371 of International Patent Application No. PCT/EP2018/054608 filed February 26, 2018, which claims priority to and the benefit of German Patent Application No. DE102017105193.7 filed March 10, 2017, all of which are hereby incorporated by reference in their entirety.--.

Signed and Sealed this
Seventh Day of May, 2024

Katherine Kelly Vidal
*Director of the United States Patent and Trademark Office*